US 12,142,449 B2

(12) United States Patent
Buschmann et al.

(10) Patent No.: US 12,142,449 B2
(45) Date of Patent: *Nov. 12, 2024

(54) ACTUATION DEVICE, VEHICLE AND A METHOD FOR ACTUATION

(71) Applicant: Huf Hülsbeck & Fürst GmbH & Co. KG, Velbert (DE)

(72) Inventors: Gerd Buschmann, Velbert (DE); Artur Boczek, Aalen (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 121 days.

This patent is subject to a terminal disclaimer.

(21) Appl. No.: 17/640,676

(22) PCT Filed: Aug. 27, 2020

(86) PCT No.: PCT/EP2020/073970
§ 371 (c)(1),
(2) Date: Mar. 4, 2022

(87) PCT Pub. No.: WO2021/043664
PCT Pub. Date: Mar. 11, 2021

(65) Prior Publication Data
US 2022/0328261 A1    Oct. 13, 2022

(30) Foreign Application Priority Data

Sep. 5, 2019  (DE) ...................... 10 2019 123 841.2
Dec. 27, 2019 (DE) ...................... 10 2019 135 829.9

(51) Int. Cl.
*H01H 9/04*        (2006.01)
*B60Q 1/00*        (2006.01)
(Continued)

(52) U.S. Cl.
CPC ............. *H01H 9/04* (2013.01); *B60Q 1/0017* (2013.01); *B60Q 3/20* (2017.02); *E05B 81/77* (2013.01);
(Continued)

(58) Field of Classification Search
CPC ........... H01H 9/04; H01H 3/02; H01H 3/161; H01H 2003/007; H01H 13/06; H01H 9/02;
(Continued)

(56) References Cited

U.S. PATENT DOCUMENTS 6,091,066 A    7/2000  Sugihara
6,626,473 B1   9/2003  Klein et al.
(Continued)

FOREIGN PATENT DOCUMENTS

DE    102011008989 A1    7/2012
DE    102014107407 A1    11/2015
(Continued)

OTHER PUBLICATIONS

Office Action for European Application No. 20765231.4 mailed on Oct. 2, 2023, with its English translation, 8 pages.
(Continued)

*Primary Examiner* — Lheiren Mae A Caroc
(74) *Attorney, Agent, or Firm* — Peter W. Schroen; Bret E. Field; Bozicevic, Field & Francis LLP

(57) ABSTRACT

An actuation device for mounting on a vehicle part, in particular in the form of a door or a hinged closure element, is provided. The subject actuation device includes: an electrical switch having at least one switching element for triggering a vehicle function; and a housing unit having at least a first and a second housing portion, which at least partly form a housing interior, in which the switching element is arranged, the second housing portion being movable, at least in some regions, relative to the first (Continued)

housing portion from an idle position into an actuation position in order to actuate the switching element. A vehicle and an actuation method are also provided.

21 Claims, 4 Drawing Sheets

(51) Int. Cl.
*B60Q 3/20* (2017.01)
*E05B 81/76* (2014.01)
*G05G 1/02* (2006.01)
*G05G 5/05* (2006.01)
*G05G 25/00* (2006.01)
*H01H 3/02* (2006.01)
*H01H 3/16* (2006.01)
*E05B 81/54* (2014.01)
*H01H 3/00* (2006.01)

(52) U.S. Cl.
CPC ............. *G05G 1/02* (2013.01); *G05G 5/05* (2013.01); *G05G 25/00* (2013.01); *H01H 3/02* (2013.01); *H01H 3/161* (2013.01); *E05B 81/54* (2013.01); *G05G 2505/00* (2013.01); *H01H 2003/007* (2013.01)

(58) Field of Classification Search
CPC .......... H01H 3/16; H01H 3/00; B60Q 1/0017; B60Q 3/20; B60Q 1/00; E05B 81/77; E05B 81/54; E05B 17/10; E05B 83/18; E05B 81/76; E05B 77/34; G05G 1/02; G05G 5/05; G05G 25/00; G05G 2505/00; H03K 17/953; H03K 17/955; H03K 2217/958; H03K 17/97; H03K 17/975; B60R 16/02
See application file for complete search history.

(56) References Cited

U.S. PATENT DOCUMENTS

| | | | |
|---|---|---|---|
| 7,777,141 B2 * | 8/2010 | Ishiguro | ............... E05B 81/76 |
| | | | 200/341 |
| 9,487,974 B2 | 11/2016 | Saitou | |
| 11,390,246 B2 | 7/2022 | Spick et al. | |
| 2004/0256210 A1 | 12/2004 | Morita et al. | |
| 2008/0034821 A1 | 2/2008 | Ishiguro | |
| 2008/0034921 A1 | 2/2008 | Vanheusden et al. | |
| 2010/0072050 A1 | 3/2010 | Kubota | |
| 2012/0039052 A1 | 2/2012 | Valles Rangel et al. | |
| 2015/0368935 A1 | 12/2015 | Sugita et al. | |
| 2016/0211094 A1 | 7/2016 | Fuchs et al. | |
| 2016/0217953 A1 | 7/2016 | Ely et al. | |
| 2018/0209182 A1 | 7/2018 | Beck et al. | |
| 2022/0328263 A1 * | 10/2022 | Buschmann | ............. G05G 5/05 |
| 2022/0336162 A1 * | 10/2022 | Boczek | .................. E05B 77/34 |

FOREIGN PATENT DOCUMENTS

| | | |
|---|---|---|
| DE | 102015000465 A1 | 7/2016 |
| DE | 202016001147 U1 | 5/2017 |
| EP | 1108834 A2 | 6/2001 |
| WO | WO0140607 A1 | 6/2001 |
| WO | WO2006106033 A1 | 10/2006 |
| WO | WO2018197771 A1 | 11/2018 |

OTHER PUBLICATIONS

Office Action for European Application No. 20767485.4 mailed on Oct. 4, 2023, with its English Translation, 8 pages.
Office Action for European Application No. 20765233.0 mailed on Oct. 4, 2023, with its English Translation, 8 pages.
Office Action for European Patent Application No. 20 765 231.4, mailed Mar. 11, 2024, and its English translation, 22 pages.

* cited by examiner

ACTUATION DEVICE, VEHICLE AND A METHOD FOR ACTUATION

INTRODUCTION

The invention relates to an actuation device, a vehicle and a method for actuation.

State of the art actuation devices for vehicles are known. These are usually mounted on a movable part, such as a tailgate, in order to enable a user to open the movable part. The opening is thereby triggered by an electrical switch, which outputs an electrical switching signal depending on the actuation by the user. However, sealing of such switches is often complex, particularly in the exterior of the vehicle. Further, the actuation devices are sometimes arranged in a recess of the vehicle sheet metal. It is therefore desirable to design the actuation devices as compactly as possible, in particular as flatly as possible.

It is an object of the present invention to at least partially eliminate the aforementioned disadvantages known from the prior art. In particular, it is an object of the present invention to enable a compact, preferably flat, actuation device in which a means for switching is protected from the environment with improved actuating capability.

SUMMARY

The foregoing problem is solved by an actuation device having the features as described herein, a vehicle having the features as described herein, and a method for actuation having the features as described herein. Further features and details of the invention result from the respective dependent claims, the description, and the drawings. In this context, features and details described in connection with the actuation device according to the invention also apply, of course, in connection with the vehicle according to the invention and/or the method for actuation according to the invention, and vice versa in each case, so that reference is or can always be made mutually with regard to the disclosure concerning the individual aspects of the invention.

In accordance with a first aspect of the invention, an actuation device is provided for mounting on a vehicle part, in particular in the form of a door or a flap. The actuation device comprises an electrical switching device/means having at least one switching element for triggering a vehicle function. Further, the actuation device comprises a housing unit with at least a first and a second housing section. The first and second housing sections at least partially or completely form a housing interior in which the switching element is arranged. The second housing section is at least partially or completely movable relative to the first housing section from a rest position into an actuation position for actuating the switching element. Thereby, the housing interior extends at least within the region between the second housing section and a fluid-tight deformation area for elastically deforming the first housing section. The deformation area is mechanically coupled to a circumferential connection area of the first and second housing sections, so that the connection area can be moved along with the movement of the second housing section from the rest position into the actuation position.

In particular, the actuation device is configured to trigger a vehicle function as a result of an actuation by a user and/or as a result of an actuation of the switching device. Preferably, the actuation device is arrangeable on an outer side of the vehicle part. The vehicle part may, for example, be a vehicle panel. In particular, the vehicle part may be a movable vehicle part, such as a vehicle door, a hatch and/or a tailgate. However, it is also conceivable that the actuation device can be arranged on a rigid vehicle part, for example in order to actuate a movable vehicle part arranged next to it. In particular, the actuation device may form a push switch, in particular with a vehicle emblem, or a door handle. Furthermore, it is also conceivable that the actuation device can be arranged in an interior region of the vehicle.

The electrical switching device is preferably adapted to emit an electrical switching signal when the second housing section is moved from the rest position to the actuation position. The electrical switching device may, for example, be an electrical switch, in particular a microswitch. Furthermore, it is conceivable that the electrical switching element is an electronic component formed in cooperation with a further component for detecting the actuation. For example, the electrical switching element may comprise a semiconductor component which outputs the electrical switching signal when the actuation device is actuated. In particular, the switching device may comprise a plurality of switching elements in order to be able to control different vehicle functions and/or to increase an actuation area that can be detected by the switching device.

The first and second housing sections may each have at least one housing element. In this regard, a first housing element of the first housing section may be attached to a second housing element of the second housing section in the connection area. Preferably, the first and second housing sections may be attached to each other only in the connection area. When the second housing section is moved from the rest position to the actuation position, the second housing element may be moved completely or deformed in areas. For example, the housing interior may have a movement clearance between the first housing section and the second housing section for moving the second housing section from the rest position to the actuation position. Preferably, the second housing section is at least partially movable into the movement-free space when moving from the rest position to the actuation position. The movement-free space may be limited by a stop. Preferably, the movement-free space is configured in such a way that the second housing section, during the movement from the rest position into the actuation position, covers at least partially or completely a distance of less than or equal to 5 mm, preferably of less than or equal to 1 mm, particularly preferably of 0.1 mm to 0.3 mm. As a result, a tactile pulse or a swipe across the actuation device may be sufficient to actuate the switching element.

In particular, the deformation area is configured to deform elastically. As a result, when the second housing section is moved from the actuation position to the rest position, a reformation back to normal can be automatically performed. In the actuation position, the second housing section may be elastically biased, for example by the deformation area, so that the second housing section automatically returns to the rest position. Due to the fact that the housing interior extends between the second housing section and the deformation area, the deformation area lies in particular below the second housing section as seen from an outside of the actuation device. In this way, lateral installation space can be saved in particular.

In particular, the connection area is formed circumferentially around the housing interior and/or the first and/or second housing section. For example, the connection area may comprise connection areas distributed regularly or irregularly around the circumference of the housing interior and/or the first and/or second housing section. By means of the connection area, the first and second housing section are in particular fixed to each other. Preferably, the first and/or second housing section and/or the housing interior has a circular circumference, Advantageously, the connection area may extend along the circular circumference. Preferably, the housing interior may comprise a closed, in particular fluid-tight, volume.

Due to the mechanical coupling of the deformation area and the circumferential connection area, the second housing section can be actuated directly or indirectly over its entire surface. Preferably, the actuation device can provide an actuating surface, in particular an external actuating surface, which can be used over its entire surface for actuating the switching device. At the same time, the actuation device can have a compact shape, i.e. in particular a shape that can be arranged flat on the vehicle part. Furthermore, an advantageous movability of the second housing element can be achieved via the deformation area. At the same time, the housing interior with the switching element can be protected from environmental influences, at least in certain areas, by the deformation area.

Furthermore, in an actuation device according to the invention, it may advantageously be provided that the connection area is configured for fluid-tight connection of the first and second housing sections, in particular wherein the connection area comprises a continuously circulating connection of the first and second housing section. In particular, the fluid-tight connection may be enabled by the continuous circumferential connection. Alternatively, an element/means for sealing may be provided to seal unconnected portions. The fluid-tight connection may enable the connection area to provide a complete circumferential seal around the interior of the housing to protect the switching element from environmental influences. Furthermore, the fluid-tight connection may allow the connection area to be arranged, for example, on an outer periphery of the actuation device. In this regard, it is particularly conceivable that the housing unit comprises an opening for cable routing, which can be arranged at an opening to a vehicle interior. A low level of moisture may be present in the vehicle interior, which is tolerable for the switching device to function properly.

Furthermore, in an actuation device according to the invention, it is conceivable that the connection area comprises a material-locking connection of the first and second housing sections, in particular wherein the first housing section is bonded or welded to the second housing section. The material-locking connection may eliminate the need for a separate seal, for example in the form of an elastomer, for the interior of the housing. Advantageously, the connection area may comprise a circumferential weld seam, Thus, a fastening and a reliable sealing of the housing interior to the connection area can be achieved simultaneously. For example, the first and second housing sections may be bonded by a sealing paste or by a double-sided adhesive tape. Preferably, the first and second housing sections comprise a plastic material. This may allow for a simple welded connection. Furthermore, a material-locking connection has the advantage that the sealing achieved thereby provides a high degree of process reliability. For example, incorrect assembly of an additional component, such as a sealing ring, can be excluded. It is conceivable that a double-sided adhesive tape is arranged in the connection area for bonding the first and second housing sections.

Furthermore, in an actuation device according to the invention, it can advantageously be provided that the switching device comprises an electromagnetic sensor unit with an electrically conductive conductor element, the switching element being designed for electromagnetic, in particular inductive or capacitive, detection of the conductor element. Preferably, the switching element thereby comprises a coil. For example, the sensor unit may comprise one or more LOC sensors. As a result, a required travel distance of the second housing section from the rest position to the actuation position may be shortened. Advantageously, the conductive element may comprise a metal, in particular a metal foil. In particular, the conductor element may also comprise a further function, such as a suspension or the like. Preferably, the conductor element is mechanically coupled to the second housing section or integrated into the second housing section. Advantageously, by means of the electromagnetic sensor unit a movement of the conductor element may be detectable via an electric field, i.e. for example by a change of the electric field. The sensor unit may comprise a measuring device for directly or indirectly measuring an electromagnetic quantity. Thus, the switching device may be an inductive or capacitive sensor unit. In particular, in the case of an inductive sensor unit, the switching device may comprise a plurality of switching elements in order to allow a wide actuation range and/or detection range.

It is further conceivable that the switching device comprises a detection element for detecting an approach of a user, preferably by means of which the switching element, upon the approach of the user, can be brought from a deactivation state, in which the triggering of the vehicle function by the switching element is prevented, into an activation state, in which the triggering of the vehicle function by the switching element is enabled. In the deactivation state, actuation of the switching element may be prevented, and in the activation state, actuation of the switching element may be enabled. For this purpose, the switching element may, for example, be electrically separable from an electrical connection to the vehicle and/or to electronics of the actuation device. Furthermore, it is conceivable that the triggering of the vehicle function in the deactivation state is prevented by software. Preferably, the detection element may comprise a proximity sensor. The proximity sensor may, for example, be a capacitive sensor. However, it is also conceivable that the sensing element is configured to authenticate a user. For example, the proximity sensor may comprise a UWB and/or NFC interface, in particular in the form of an antenna. It is further conceivable that the sensor comprises a Bluetooth interface, in particular in the form of a Bluetooth low energy interface. By detecting the approach, a probability of a false triggering, for example during a journey of the vehicle, can be reduced. By the subsequently enabled, in particular manual, actuation of the switching device, a safety of the actuation device may further be increased. Furthermore, it is conceivable that the UWB interface is integrated in a separate HSM module.

Furthermore, in an actuation device according to the invention, it may advantageously be provided that the switching element is arranged on the first housing section and the conductor element is arranged on the second housing section, so that the movement of the second housing section from the rest position to the actuation position causes a shortening of a distance between the conductor element and the switching element. In particular, the movement of the second housing section from the rest position to the actuation position comprises a movement in the direction of the first housing section. When the distance between the conductor element and the switching element is shortened, a change in an electric and/or magnetic field between the conductor element and the switching element may advantageously be detectable. However, it is equally conceivable that the switching element and the conductor element are arranged on the first housing section. For example, the conductor element may be arranged at the deformation area and/or formed by the deformation area. When the deformation area is deformed, this can also cause a change in an electric and/or magnetic field which can be detected by the switching element. In this way, the actuation device can be compactly configured and enable advantageous actuation detection. Alternatively, it is conceivable that the switching element is arranged at the second housing section and the conductor element is arranged at the first housing section, so that the movement of the second housing section from the rest position to the actuation position causes a shortening of a distance between the conductor element and the switching element. Thus, it may be provided that the conductor element remains rigid during the movement of the second housing section, and instead the switching element moves toward the conductor element.

Preferably, in an actuation device according to the invention, it can be provided that the first housing section has a support element for a printed circuit board on which the switching device is arranged, in particular wherein the printed circuit board has electronics for evaluating sensor data of the switching device. The circuit board may be arranged indirectly or directly on the support element. The support element may be formed separately from the deformation area or integrally with the deformation area. The support element may extend within the housing interior or may at least partially form the housing interior with the second housing section and the deformation area. Preferably, the support element is at least partially enclosed by the deformation area in the housing interior. By evaluating the sensor data by the electronics in the housing interior, transmission losses can be kept low or avoided. During the evaluation, for example, measured values of the switching device can be interpreted and/or digitized by the electronics. Preferably, a false triggering can be detectable by the evaluation on the basis of measured data of a plurality of switching elements of the switching device. Alternatively, it can be provided that the second housing section has a support element for a printed circuit board on which the switching device is arranged, in particular wherein the printed circuit board has electronics for evaluating sensor data of the switching device. In particular, the switching element may be arranged on the second housing section and the conductor element may be arranged on the first housing section. This allows the conductor element to remain rigid during movement of the second housing section.

Furthermore, in an actuation device according to the invention, it may advantageously be provided that the printed circuit board is encapsulated with a potting compound or is covered with a protective lacquer. The printed circuit board, in particular with the electronics, may be completely embedded in the potting compound. For this purpose, a part of the interior of the housing may be filled with the potting compound. This has the advantage of providing additional protection against environmental influences, in particular against moisture. The potting compound may comprise, for example, a resin, in particular a synthetic resin. A protective lacquer has the advantage that additional protection against moisture can also be provided. At the same time, the protective lacquer may require only a small amount of installation space in the interior of the housing. The potting compound or the protective lacquer can increase the service life of the printed circuit board and/or the electronics. The potting compound or the protective lacquer may be arranged between the printed circuit board and the support element and/or between the printed circuit board and the first or second housing section.

Further, in an actuation device according to the invention, it may be advantageously provided that the first housing section comprises a cover element forming a connection area of the connection area. The connection portion of the connection area may form the connection area with a connection area of the second housing section. The cover member may preferably be a separate component from the support element. As a result, the support element may be completely or substantially completely disposed within the interior of the housing. Preferably, the cover element comprises the connection area. In particular, the cover element may form a vehicle-side housing half of the housing unit. Preferably, the cover element comprises connection interfaces for connecting the actuation device to the vehicle part. In particular, the cover element can be screwed to the vehicle part. This may enable the actuation device to be securely fastened to the vehicle part. A fastener, such as a screw, may thereby be mounted to the cover element via the interior of the housing, such that the fastener is advantageously invisible from an exterior of the second housing section. The cover element may be formed as a unitary material or as a multi-component injection molded plastic part. For example, the cover element may comprise a soft component in the deformation area to allow or promote deformation.

Furthermore, in an actuation device according to the invention, it is conceivable that the cover element forms the deformation area, in particular whereby a restoring force can be exerted by the cover element against the movement of the second housing section from the rest position to the actuation position. For example, the cover element may comprise an elastically deformable plastic and/or a flexible shape to form the deformation area. In particular, the cover element may have a thickness in the deformation area of less than 2 mm, preferably less than 1 mm, more preferably 0.5 mm. This may allow elastic deformation circumferentially around the housing section i.e. in particular around the entire circumference of the deformation area The restoring force may enable or support an automatic return of the second housing section to the rest position.

Furthermore, in an actuation device according to the invention it is conceivable that the housing unit comprises a spring element for exerting a restoring force against the movement of the second housing section from the rest position into the actuation position, in particular wherein the spring element is arranged in the housing interior. Advantageously, the spring element may comprise a spring steel or a resilient plastic. The spring element may, for example, be a leaf spring. The spring element may be formed separately from the deformation area. In particular, the restoring force may act in addition to a restoring force of the deformation area. However, it is also conceivable that the spring element forms the deformation area. In this case, the spring element may be integrated into the first housing section, i.e. in particular be part of the first housing section. Furthermore, the spring element may extend circumferentially around the housing interior, the support element and/or the cover element. The spring element may allow the second housing section to be automatically moved back to the rest position. If the spring element and the deformation area can each exert a separate restoring force, a resulting stiffness can have a beneficial effect on an actuation behavior of the second housing section.

It is further conceivable in an actuation device according to the invention that the spring element forms the conductor element of the switching device, in particular wherein a relative movement of the switching element to the spring element can be detected. Preferably, the spring element comprises an electrically conductive spring material or consists of an electrically conductive spring material. This allows the spring element to be part of the electromagnetic sensor unit. When the switching element is elastically moved relative to the spring element during an actuation of the actuation device and/or during movement of the second housing section from the rest position to the actuation position, this may affect an electric and/or magnetic field. The change in the electric and/or magnetic field may be detected by the switching element. As a result, an additional conductor element is not necessary, for example. Thus, a small number of components can be achieved and thereby a complexity of the actuation device can be simplified.

Preferably, in an actuation device according to the invention, it may be provided that the connection area comprises the spring element, wherein the spring element extends circumferentially around the support element. In this regard, the spring element may advantageously be part of the first housing section. Preferably, the spring element may form a fluid-tight, elastically deformable housing surface. In particular, the housing surface formed by the spring element may be oriented towards the vehicle. In this regard, the spring element may in particular form the deformation area of the second housing section. In this way, the actuation device can be compactly designed and enable a reliable seal with few components.

Preferably, in an actuation device according to the invention, it can be provided that the spring element is connected to the second housing section in a material-locking, force- and/or form-fitting manner, in particular wherein the spring element is embedded or clamped in a region-wise manner in a housing material of the second housing section and/or wherein the spring element is bonded to the second housing section by a sealing element. As a result, the spring member may form a connection section of the connection area. For example, the spring element may be regionally overmolded and/or overmolded with a housing material of the second housing section, Additionally or alternatively, the spring element may be connected to the second housing section via a sealing paste, in particular in the form of a sealing bead. In particular, the spring element may thereby be positively arranged, in particular clamped, in the second housing section. A form-fitting and material-locking connection of the spring element to the second housing section can enable a reliable connection of the spring element to the second housing section, and thus a reliable connection of the first and second housing sections. Furthermore, an advantageous sealing of the housing interior can thereby be created, in particular without requiring an additional seal.

Furthermore, it is conceivable in an actuation device according to the invention that the housing unit has a positioning element/means by which the rest position of the second housing section can be fixed, in particular in a form-fitting manner. From the rest position, it can thereby advantageously be possible to execute a renewed movement of the second housing section from the rest position into the actuation position in order to execute a further actuation. Advantageously, the positioning element may comprise a stop means/element of the second housing section and a counter stop element of the first housing section. Thereby, the stop element may abut against the counter stop element in the rest position to stop a restoring movement of the second housing section. In particular, the positioning element may be configured to allow movement of the second housing section only towards the actuation position when the second housing section is in the rest position. Advantageously, the positioning element may comprise a latching connection. In this way, an assembly of the actuation device may be simplified. For example, the first and second housing sections may be latched together by the positioning element. This may reduce a load on the connection area due to a restoring force.

Furthermore, in an actuation device according to the invention, it can advantageously be provided that an intermediate element is arranged between the first and second housing sections, by means of which the restoring force of the spring element can be transmitted to the second housing section and/or which has at least one positioning element of the positioning element. The positioning element may, for example, be a stop element of the second housing section. The intermediate element can serve as an adapter for establishing an operative connection between the first and second housing sections, in addition to the connection area. As a result, for example, moulded parts of the second housing section can be of simplified design in order to reduce their manufacturing costs. Furthermore, the intermediate element can be used to achieve a geometry which is advantageous for a force transmission and which is, in particular, independent of a manufacturing process of further components. Preferably, the intermediate element is fixed to the first and/or second housing section. In particular, the intermediate element may be arranged in the interior of the housing. As a result, it is not necessary, for example, for the intermediate element to contribute to sealing the housing interior.

Preferably, in an actuation device according to the invention, it may be provided that an illumination unit for illuminating the actuation device is arranged at least partially or completely in the interior of the housing. The illumination unit may improve a visibility of the actuation device, in particular in the dark. Furthermore, the illumination unit may serve as an indication to a user that the illuminated area on the vehicle is an actuation device. This may allow for intuitive operation of the actuation device. The illumination unit may comprise one or more illuminants, in particular in the form of one or more LEDs. By being arranged in the interior of the housing, the illumination unit may advantageously be protected from environmental influences. For example, the illumination unit may be arranged on the printed circuit board and/or on the support element.

It is further conceivable in an actuation device according to the invention that the second housing section comprises a light guide for guiding light of the illumination unit, in particular wherein the light guide comprises a light emission surface formed circumferentially around the second housing section for circumferential illumination of the actuation device. In particular, the second housing section may be formed by the light guide. The light guide may be an at least partially transparent housing member of the second housing section. In this regard, the light guide may form a connection area of the connection area. In particular, the light emitting surface may be formed on the edge side of the connection area. This can enable advantageous utilization of the installation space, in which light can advantageously emerge to the outside. The circumferential light emitting surface can further enable advantageous illumination of the actuation device, in which the actuating surface is located in a central region of the illumination, which in particular is not itself illuminated. This may provide an intuitive indication of the actuation device on the vehicle. Furthermore, it may thereby be possible, for example, to arrange a logo, an instruction and/or a vehicle emblem in the central region without directly affecting the logo, the instruction and/or the vehicle emblem.

Furthermore, in an actuation device according to the invention, it may advantageously be provided that the second housing section comprises a vehicle emblem which forms an actuating surface for triggering the movement of the second housing section from the rest position into the actuation position, in particular wherein the vehicle emblem forms, in particular completely, an outer side of the actuation device. In particular, the vehicle emblem may be arranged on the light guide and/or a housing element of the second housing section. The vehicle emblem may thus form an intuitive indication for the user of the actuating surface. Furthermore, an area on the vehicle can thereby be used for the actuation which in any case comprises another component which is different from the vehicle part on which the actuation device is mountable. In particular, the light emitting surface may be arranged at the edge of the connection area. In particular, the light emitting surface may be oriented at least substantially or completely parallel to a surface of the vehicle part. In this regard, the vehicle emblem may completely cover the interior of the housing and/or the first housing section, so that only the vehicle emblem is visible when the actuation device is mounted on the vehicle part. The vehicle emblem can enable advantageous adaptation of the actuation device to a visual appearance of the vehicle and, in particular, at the same time provide additional protection against dirt.

It is further conceivable in an actuation device according to the invention that the housing interior comprises a compensating element for exchanging air with an environment, in particular wherein the compensating element is arranged on a cable guide for the switching device and/or the printed circuit board. This can, for example, enable a reduction of a volume of the housing interior, in particular which goes beyond a compressibility of air in the housing interior. The balancing element may be in the form of a valve. For example, the balancing element may comprise a sealing lip which allows air exchange in case of an overpressure and/or underpressure in the housing interior. The cable guide may connect the actuation device to a vehicle interior and/or to a functional element for the vehicle function actuatable by the actuation device, such as a lock for opening and/or closing the vehicle part. In particular, the switching device and/or the circuit board may be adapted to be supplied with electrical energy via cables of the cable guide. This may reduce the likelihood of dirt entering the interior of the housing at this point. Furthermore, the compensating element can compensate for a negative pressure and/or an excess pressure due to environmental conditions, such as a driving behavior of the vehicle or temperature fluctuations.

Furthermore, in an actuation device according to the invention, it ray advantageously be provided that the switching device comprises at least two or more electrical switching elements arranged in an actuating direction, so that by sweeping over the actuation device, in particular along the actuating direction, an actuating sequence can be effected in which the switching elements are actuated successively or differently. For example, a plurality of switching elements may be arranged in a row defining the actuation direction. The actuation sequence may comprise a plurality of actuation positions of the second housing section. In particular, the second housing section may have a different tilt angle in each of the actuation positions, resulting in different respective distances between the switching elements and a conductor element associated with the respective switching element. In particular, a plurality of conductor elements may also be arranged on the first or second housing section. A complex actuation action may be detectable by the actuation sequence. Thus, a recognition of a request of the user may be improved. For example, false detections and/or accidental actuation actions may be reduced. Furthermore, different vehicle functions may be triggerable by different actuation actions, such as different actuation directions.

According to another aspect of the invention, a vehicle is provided. The vehicle comprises a vehicle part, in particular in the form of a door or a flap. It is further provided that an actuation device according to the invention is arranged on the vehicle part for triggering a vehicle function of the vehicle.

Thus, a vehicle according to the invention brings the same advantages as have already been described in detail with reference to an actuation device according to the invention. The vehicle is in particular a motor vehicle, preferably in the form of an electric vehicle or a hybrid vehicle. By advantageously sealing the actuation device, an electrification of vehicle functions may be simplified. By means of the actuation device according to the invention, in particular of compact design, an external appearance of the vehicle can furthermore be improved and/or installation space in the interior of the vehicle can be saved. Preferably, the vehicle part is an exterior vehicle part and/or a body part of the vehicle.

According to a further aspect of the invention, an actuating method for triggering a vehicle function of a vehicle by an actuation device, in particular an actuation device according to the invention, having a housing interior formed by a first and a second housing section of the actuation device and extending at least regionally between the second housing section and a fluid-tight deformation area of the first housing section, the deformation area being mechanically coupled to a circumferential connection area of the first and second housing section, comprising the steps:

Actuating a switching element of an electrical switching device by moving the second housing section from a rest position into an actuation position, preferably wherein the fluid-tight deformation area is deformed, in particular elastically, and the connection area is moved along, Elastic return of the second housing section to the rest position.

Thus, a method for actuation according to the invention brings the same advantages as have already been described in detail with reference to an actuation device according to the invention and/or a vehicle according to the invention. The vehicle may be a vehicle according to the invention. The resetting of the elastic plastic of the second housing section may be performed by the deformation area and/or an additional spring element. The actuation of the switching element is preferably inductive. Before the actuation of the switching element, in particular a detection of an approach can take place, in dependence on which the switching element is brought into an activation state in which the triggering of the vehicle function, in particular the actuation of the switching element, is enabled. The actuation of the switching element takes place in particular as a result of the movement of the second housing section. Due to the fact that the circumferential connection area is moved along with the movement of the second housing section, a tuft-surface actuation possibility by a user can be provided. Thus, an actuation of the actuation device may be simplified. Furthermore, the coupling of the connection area with the deformation area may enable a compact design of the actuation device.

BRIEF DESCRIPTION OF THE FIGURES

Further advantages, features and details of the invention will be apparent from the following description, in which embodiments of the invention are described in detail with reference to the drawings. In this connection, the features mentioned in the claims and in the description may each be essential to the invention individually or in any combination. It schematically shows:

DETAILED DESCRIPTION OF THE INVENTION

In the following description of some embodiments of the invention, the identical reference signs are used for the same technical features even in different embodiments.

Figure 1:
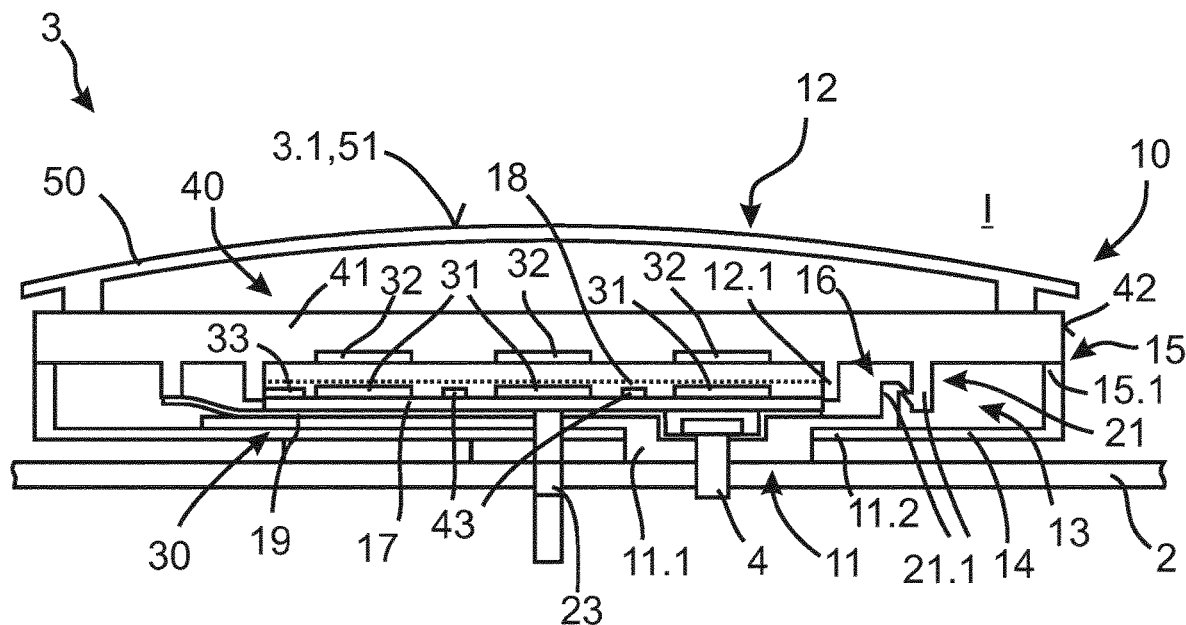
FIG. 1 a cross-sectional view of an actuation device according to the invention in a first embodiment.
Figure 5:
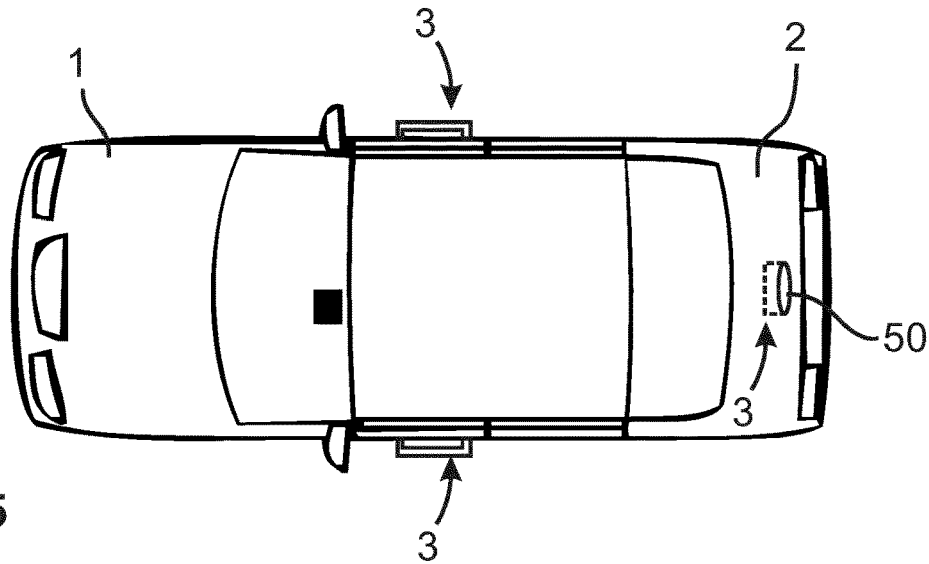
Figure 6:
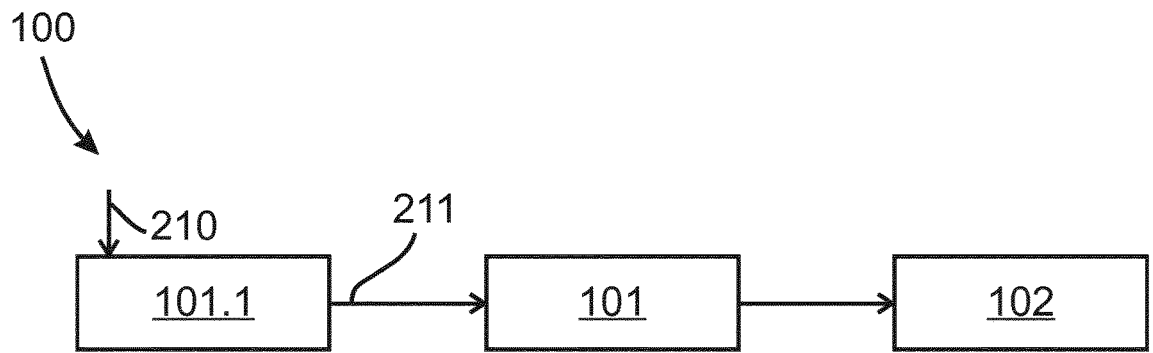

FIG. 1 shows an actuation device 3 according to the invention, which is mounted in particular on a vehicle part 2 of a vehicle 1 according to the invention. The vehicle 1 with the actuation device 3 is shown in FIG. 5. The vehicle part 2 is a movable vehicle part in the form of a tailgate. However, it is equally conceivable that the actuation device 3 can be mounted on another vehicle part, such as a side door, or in a vehicle interior. In this case, the actuation device 3 may, for example, form a door handle of the vehicle 1 or be integrated in a door handle. The actuation device 3 serves to electrically trigger a vehicle function of the vehicle 1. For example, an actuation of the actuation device 3 may open the vehicle part 2. The actuation device 3 may preferably be fixed to the vehicle part 2 by a fixing element/means 4, preferably screwed to the vehicle part 2. An actuating procedure 100 for triggering the vehicle function by the actuation device 3 is shown in schematic sequence in FIG. 6.

Figure 3:
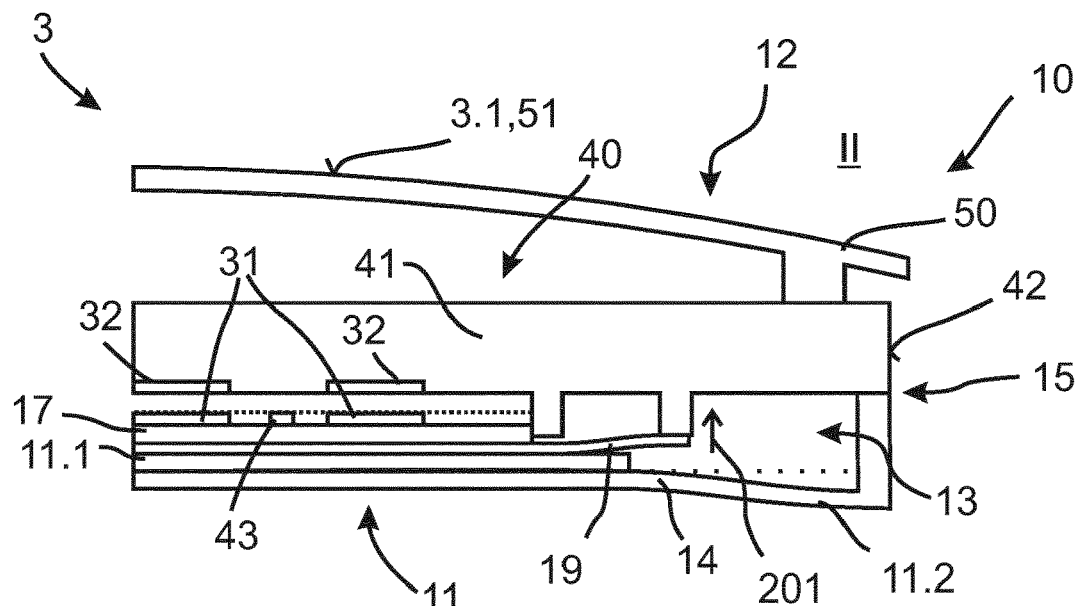

As shown in FIG. 1, the actuation device 3 has an electrical switching device 30 with several switching elements 31 for triggering the vehicle function. Instead of several switching elements 31, the actuation device 3 can also have only one switching element 31. The switching elements 31 are arranged in a housing interior 13 which is formed by a first and a second housing section 11, 12 of a housing unit 10 of the actuation device 3. As a result, the switching elements 31 are protected from environmental influences, such as dirt and/or moisture. For actuating 101 the switching element 31, the second housing section 12 of the housing unit 10 is movable from a rest position I into an actuation position II at least in regions relative to the first housing section 11. The actuation position II is shown in FIG. 3. When the second housing section 12 is moved, the second housing section 12 is moved into a movement free space 16 of the housing interior 13 at least in certain regions, as a result of which a distance between the first and second housing sections 11, 12 in the region of the housing interior 13 is reduced. For this purpose, the actuation device 3 has an actuating surface 51 on an outer side 3.1, on which a user can exert a pressure for moving the second housing section 12 from the rest position I to the actuation position II. The second housing section 12 comprises a vehicle emblem 50, which forms the outer side 3.1 and the actuating surface 51. In particular, only the outer side 3.1 of the actuation device 3 is visible from outside the vehicle 1.

Figure 2:
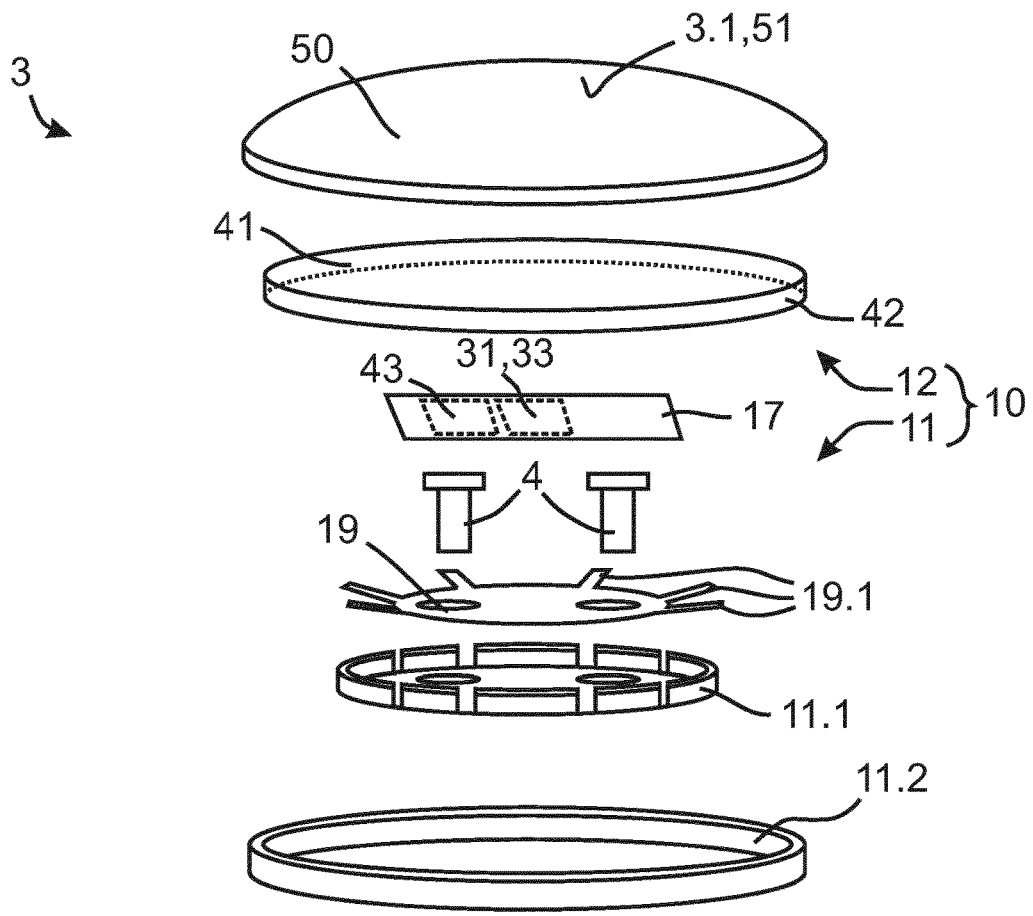
FIG. 2 is a simplified exploded view of the actuating device, FIG. 3 the actuation device in a partially enlarged cross-sectional view, FIG. 4 an operating relationship of a housing unit of the actuating device, FIG. 5 a vehicle according to the invention with the actuation device, FIG. 6 a method according to the invention for triggering a vehicle function of the vehicle by the actuation device in schematic representation of method steps, B FIG. 7 an actuation device according to the invention in a partially enlarged cross-sectional view in a second embodiment, FIG. 8 a functional relationship of a housing unit of the actuating device of the second embodiment, FIG. 9 an actuation device according to the invention in a partially enlarged cross-sectional view in a further embodiment, and FIGS. 10a-10b different actuation positions of the actuation device of the first embodiment for effecting an actuation sequence.

The first housing section 11 further comprises a fluid-tight deformation area 14 which is elastically deformed when the second housing section 12 is moved from the rest position I to the actuation position II. For fluid-tight configuration of the deformation area 14, the first housing section 11 has a cover element 11.2 which is formed in a shell-like manner, as shown in the simplified exploded view in FIG. 2. The housing interior 13 further extends at least regionally between the second housing section 12 and the deformation area 14, the deformation area 14 being arranged in particular between the vehicle part 2 and the second housing section 12, thereby enabling a compact design of the actuation device 3. The cover element 11.2 can be of unitary material design or have a soft component 14.1 in the deformation area 14.

Furthermore, the first and second housing sections 11, 12 are connected to each other in a fluid-tight manner in a connection area 15, in particular on all sides of the housing interior 13. Preferably, the connection area 15 is thereby continuously circumferentially formed and comprises a material connection of the first and second housing sections 11, 12. For example, the first and second housing sections 11, 12 may be welded or glued to each other in the connection area 15 to ensure a continuously circumferential sealing of the housing interior 13 in the connection area 15. The deformation area 14 and the connection area 15 are further mechanically coupled to each other, so that the connection area 15 can be moved along with the deformation area 14 when the deformation area 14 is deformed as a result of the movement of the second housing section 12 from the rest position I to the actuation position II In this case, the cover element 11.2 forms the deformation area 14 and a connection section 15.1 of the connection area 15. As a result, a user can use the full surface of the actuating surface 51 of the actuation device 3 for actuation. Depending on the configuration of the switching device 30, it does not matter whether the user presses on the outer surface 3.1 only in a certain area, whereby an operation of the actuation device 3 may be simplified.

Figure 4:
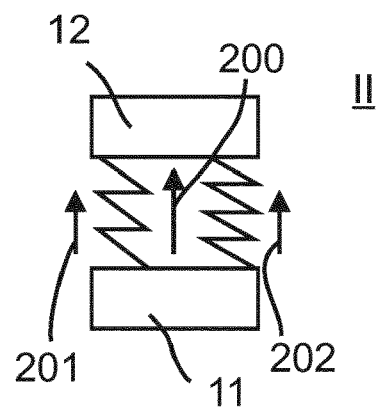

The housing unit 10 further comprises a spring element 19, which exerts a restoring force 201 on the second housing section 12 when the second housing section 12 is moved from the rest position I to the actuation position II The spring element 19 may have a plate-like configuration. Preferably, the spring element 19 comprises a plurality of spring sections 19.1 to provide a circumferential spring action. An interaction of the first and second housing sections 11, 12 with the spring element 19 and the deformation area 14 is shown in FIG. 4. In particular, the deformation area 14 and the spring element 19 have different spring stiffnesses. A total force 200 thereby results from a restoring force 202 of the deformation area 14 and the restoring force 201 of the spring element 19. As a result, an elastic restoring 102 of the second housing section 12 into the rest position I can be automatically effected, in particular after a user has released a pressure from the second housing section 12. Further, this may allow for advantageous rigidity of the actuation device 3, particularly during actuation. In order to fix the second housing section 12 in the non-actuated state in the rest position I, in particular in a form-fitting manner, the housing unit 10 further comprises a positioning device 21. This is preferably a latching connection, in which a positioning element 21.1 in the form of a stop element of the second housing section 12 bears against a positioning element 21.1 in the form of a counter stop element of the second housing section 12 in the rest position I. In order to enable an air exchange of the housing interior 13 with an environment, a compensating element 23 may be integrated in a cable guide or arranged on the cable guide.

The switching device 30 comprises an electromagnetic sensor unit, in particular in the form of an LDC sensor. Each of the switching elements 31 is associated with a conductor element 32 which is arranged on the second housing section 12, in particular integrated in the second housing section 12. The switching elements 31 are further configured for electromagnetic, i.e. in particular inductive, sensing of one of the conductor elements 32 in each case. Alternatively, capacitive sensing of the respective conductor element 32 is conceivable, for example. When the second housing section 12 is moved, the conductor elements 32 are moved towards the switching elements 31. A change in an electric and/or magnetic field caused thereby can be detected by the switching elements 31. For evaluating sensor data of the switching device 30, a printed circuit board 17 is further arranged in the housing interior 13, which has electronics for evaluating sensor data of the switching device 30. The printed circuit board 17 is thereby arranged on a support element/means 11.1 of the first housing section 11 and is preferably encapsulated, in particular, with a transparent encapsulation compound 18 and/or covered with a protective lacquer. In this way, the electronics in particular can be protected from environmental influences. The sensor data can be evaluated or pre-evaluated by the electronics. For example, the electronics may be configured to detect errors and/or digitize the sensor signals. Alternatively to the plurality of conductive elements 32, it is conceivable that the spring element 19 is formed as a conductive element when the switching element 31 is arranged on the second housing section 12.

Preferably, the switching device 30 further comprises a detection element for detecting 101.1 an approach of a user, by means of which the switching elements 31 can be brought from a deactivation state 210 to an activation state 211 upon the approach of the user. Alternatively, it is further conceivable that the detection element/means 33 is formed by a module separate from the switching device 30. In the deactivation state 210, actuation, in particular manual actuation, of the switching device 31 by moving the second housing section 12 from the rest position I to the actuation position II is prevented. In particular, triggering of the vehicle function is prevented in the deactivation state 210. For example, the switching elements 31 may be electrically deactivated and/or electrically disconnected. In the activation state, actuation of the switching elements 31 is possible. The detection element 33 may comprise, for example, a UWB or NFC interface, in particular in the form of an antenna, to detect an approach of a user to the actuation device 3. In particular, the detection 101.1 of the approach of the user and the transfer of the switching elements 31 from the deactivation state 210 to the activation state 211 thus take place before the actuation 101 of the switching elements 31.

Figure 10A:
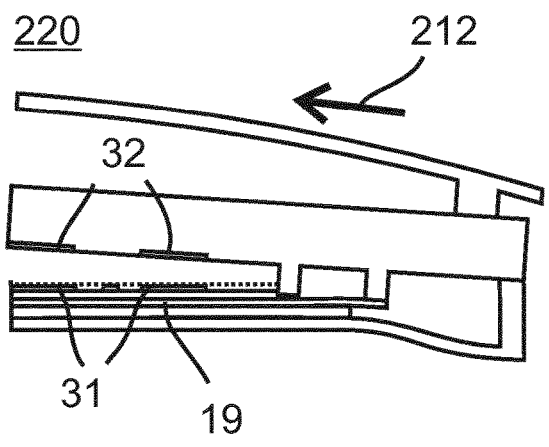
Figure 10B:
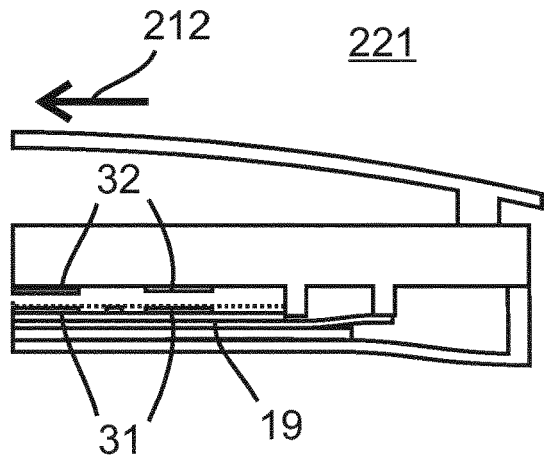

FIGS. 10a and 10b further show different actuation positions 220, 221 into which the second housing section 12 can be brought by sweeping over the actuation device 3. Preferably, the switching elements 31 are arranged in an actuation direction 212, so that an actuation sequence in which the switching elements 31 are actuated one after the other can be effected by swiping over the actuation device 3. If a user starts his actuating action at an outer edge of the outer side 3.1, it may be provided that the second housing section 12 is tilted in that the first housing section 11 is more deformed in the area of actuation than at the opposite side. If the user then continues his actuation action along the actuation direction 212, as shown in FIG. 10b, the second housing section 12 aligns and the distances of the switching elements 31 to the conductor elements 32 change accordingly. Based on the distances of the switching elements 31, it can be detected whether there is a first actuation position 220 as shown in FIG. 10a or a second actuation position 221 as shown in FIG. 10b. Thus, a more complex actuation action can be detected.

Furthermore, an illumination unit 40 for illuminating the actuation device 3 is arranged in the housing interior 13. The illumination unit 40 comprises at least one light source 43, for example in the form of an LED, which is arranged in the housing interior 13, preferably on the printed circuit board 17. In particular, the light source 43 is arranged on a side of the printed circuit board 17 facing the second housing section 12. Furthermore, the illumination unit 40 comprises a light guide 41 formed as a transparent housing element of the second housing section 12. The light guide 41 further comprises a circumferential light emitting surface 42 for circumferentially illuminating the actuation device 3 circumferentially around the second housing section 12. In particular, the light emitting surface 42 is arranged on the edge side of the connection section 15. This allows a circle of light to be created around the vehicle emblem 50 without a user being aware of the illumination unit 40 itself.

Figure 7:
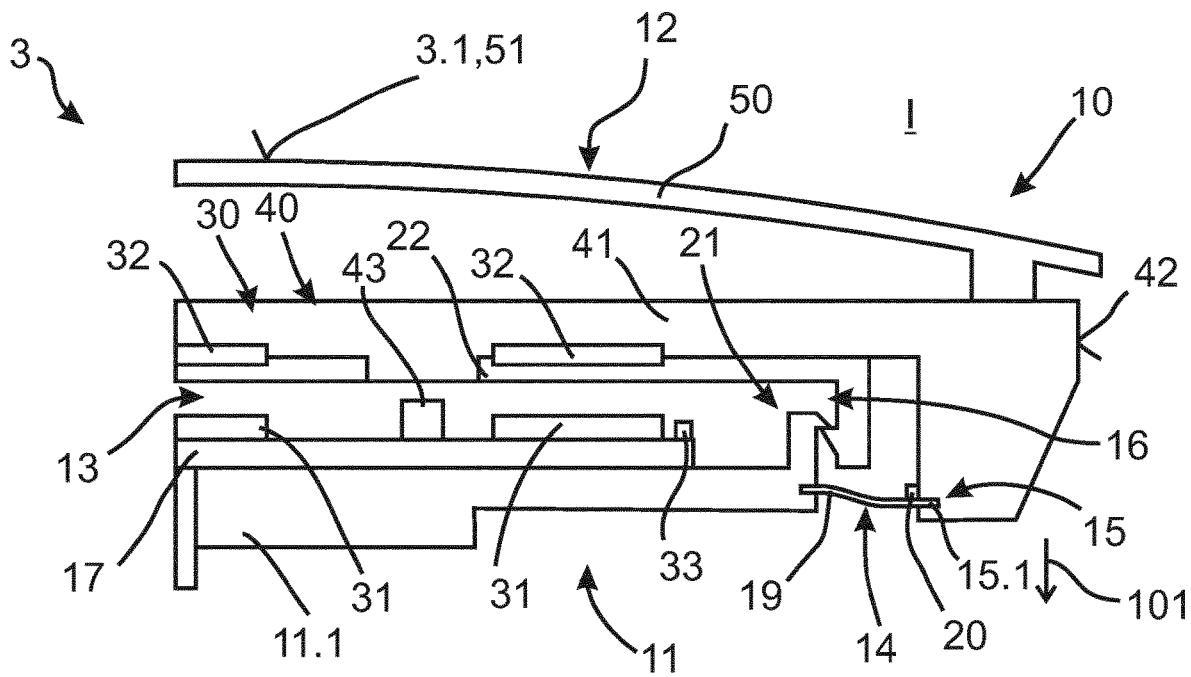
Figure 8:
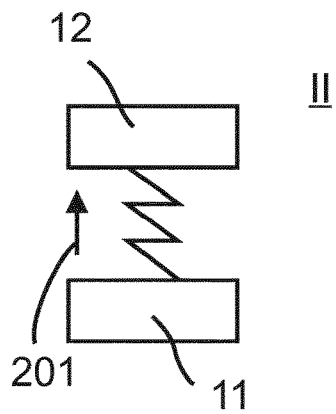

FIG. 7 shows an actuation device 3 in a further embodiment, which is mounted in particular on a vehicle part 2 of a vehicle 1 according to the invention. The vehicle 1 may be the vehicle 1 shown in FIG. 5. In this case, the actuation device 3 is configured in particular similarly to the actuation device 3. In order to allow a movement of a second housing section 12 from a rest position I to an actuation position II for actuating an electrical switching device 30, a first housing section 11 comprises a circumferential spring element 19 forming a fluid-tight deformation area 14 of the first housing section 11. For example, the spring element 19 may be ring-like in shape. Further, the spring element 19 is molded to a support element 11.1 of the first housing section 11 and the second housing section 12. A printed circuit board 17 is directly arranged on the support element 11.1. As a result, the spring element 19, i.e. in particular a portion of the spring element 19 fixedly connected to the second housing section 12, forms a connection section 15.1 of a substance-locking connecting area 14 for connecting the first and second housing section 11, 12. Additionally or alternatively, a sealing element 20 may be provided to seal the connection area 15 and/or to enable a substance-locking connection. As shown in FIG. 8, the spring element 19 exerts a restoring force 201 on the second housing section 12 when the second housing section 12 is in the actuation position II.

For triggering a vehicle function of the vehicle 1, the electrical switching device 30 further comprises an electromagnetic sensor unit having an electrically conductive conductor element 32 and a switching element 31. The conductor element 32 is thereby integrated into the second housing section 12 or arranged on the second housing section 12. As a result, a distance between the conductor element 32 and the switching element 31 is reduced when the second housing section 12 is moved from the rest position I to the actuation position II. The reduction of the distance can be detected inductively or capacitively by the switching element 31. Additionally or alternatively, it may be provided that the spring element 19 forms a conductor element 32 of the switching device 30. An intermediate element 22 is further arranged between the first and second housing sections 11, 12 and comprises a positioning element 21.1 of a positioning element for materially locking the rest position I of the second housing section 12. As a result, the second housing section 12 may have a shape that is easy to manufacture and/or the conductor element 32 may be fixed between the intermediate element 22 and the second housing section 12. In particular, the intermediate element 22 is fixed to the second housing section 12 in a housing interior 13.

Figure 9:
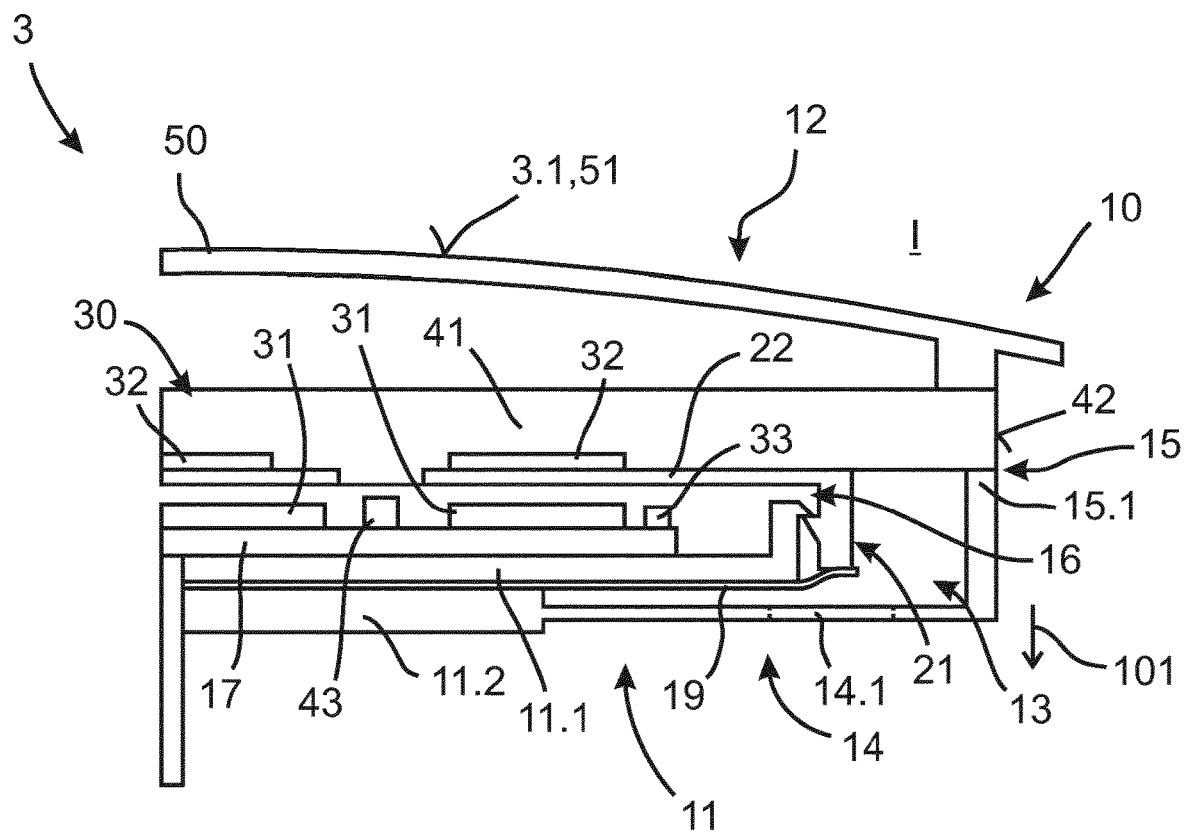

FIG. 9 shows an actuation device 3 in a further embodiment, which is mounted in particular on a vehicle part 2 of a vehicle 1 according to the invention. The vehicle 1 may be the vehicle 1 shown in FIG. 5. In this case, the actuation device 3 of the embodiment example of FIG. 9 corresponds essentially to the actuation device 3 of the embodiment example of FIG. 7. However, in this case, a cover element 11.2 of a first housing section 11 forms a fluid-tight deformation area 14 and a connection section 15.1 of a connection area 15 for connecting the first housing section 11 to a second housing section 12 of a housing unit 10 of the actuation device 3. The cover element 11.2 can be of unitary material design or be designed as a two-component plastic injection-moulded part and have a soft component 14.1 in the deformation area 14. In addition, the actuation device 3 has a spring element 19 in a housing interior 13 formed by the first and second housing sections 11, 12, which is therefore protected by the housing unit 10. This results in a spring behavior as shown in FIG. 4 when the second housing section 12 is moved from a rest position I to an actuation position II for actuating an electric switching device 30.

The foregoing explanation of the embodiments describes the present invention solely in the context of examples. Of course, individual features of the embodiments can be freely combined with each other, provided that this is technically sensible without leaving the scope of the present invention.

LIST OF REFERENCE SIGNS

1 Vehicle
2 Vehicle part
3 Actuation device
3.1 Outer side
4 Fixing element
10 Housing unit
11 First housing section
11.1 Support element
11.2 Cover element
12 Second housing section
12.1 Holding agent
13 Housing interior
14 Deformation area
14.1 Soft component
15 Connection area
15.1 Connection section
16 Movement-free space
17 Printed circuit board
18 Encapsulation compound
19 Spring element
19i Spring section
20 Sealing element
21 Positioning device
21.1 Positioning element
22 Intermediate element
23 Compensating element
24 Cabling
30 Switching device
31 Switching element
32 Conductor element
33 Detection element
40 illumination unit
41 Light guide
42 Light emitting surface
43 Light source
50 Vehicle emblem
51 Actuating surface
100 Method for actuation
101 Actuation
101.1 Detection
102 Restoring
200 Total force
201 Restoring force from 19
202 Restoring force from 14
210 Deactivation state
211 Activation state
212 Actuation direction
220 First actuation position
221 Second actuation position
I Rest position
II Actuation position

The invention claimed is:

1. An actuation device for mounting on a vehicle part comprising:
an electrical switching device with at least one switching element for triggering a vehicle function, and a housing unit with at least a first and a second housing section which at least partially form a housing interior in which the switching element is arranged,
wherein the second housing section is movable from a rest position into an actuation position for actuating the switching element at least in regions relative to the first housing section, and
the housing interior extending at least in regions between the second housing section and a fluid-tight deformation area of the first housing section, which deformation area is mechanically coupled to a circumferential connection area of the first and second housing sections, so that the connection area can also be moved during the movement of the second housing section from the rest position into the actuation position.

2. The actuation device according to claim 1,
wherein
the connection area is configured for a fluid-tight connection of the first and second housing sections.

3. The actuation device according to claim 1, wherein
the connection area comprises a material-locking connection of the first and second housing sections.

4. The actuation device according to claim 1, wherein
the switching device comprises an electromagnetic sensor unit having an electrically conductive conductor element, the switching element being configured for the electromagnetic detection of the conductor element.

5. The actuation device according to claim 1, wherein
the switching device comprises a detection element for detecting an approach of a user, by means of which the switching element can be brought, when the user approaches, from a deactivation state, in which the triggering of the vehicle function by the switching element is prevented, into an activation state, in which the triggering of the vehicle function by the switching element is enabled.

6. The actuation device according to claim 1, wherein
the switching element is arranged on the first housing section and the conductor element is arranged on the second housing section, so that the movement of the second housing section from the rest position to the actuation position causes a shortening of a distance between the conductor element and the switching element.

7. The actuation device according to claim 1, wherein
the first housing section has a support element for a printed circuit board on which the switching device is arranged.

8. The actuation device according to claim 7, wherein
the printed circuit board is encapsulated with an encapsulation compound or is covered with a protective lacquer.

9. The actuation device according to claim 1, wherein
the first housing portion has a cover element which forms a connecting section of the connection area.

10. The actuation device according to claim 9, wherein
the cover element forms the deformation area.

11. The actuation device according to claim 1, wherein
the housing unit has a spring element for exerting a restoring force counter to the movement of the second housing section from the rest position into the actuation position.

12. The actuation device according to claim 11, wherein
the spring element forms the conductor element of the switching device.

13. The actuation device according to claim 11, wherein
the spring element is connected to the second housing section at least in a material-locking, force-fitting or form-fitting manner.

14. The actuation device according to claim 1, wherein
the housing unit has a positioning device by means of which the rest position of the second housing section can be fixed.

15. The actuation device according to claim 1, wherein
an illumination unit for illuminating the actuation device is arranged in the housing interior.

16. The actuation device according to claim 15, wherein
the second housing section has a light guide for guiding light from the illumination unit.

17. The actuation device according to claim 1, wherein
the second housing section has a vehicle emblem which forms an actuating surface for triggering the movement of the second housing section from the rest position into the actuation position.

18. The actuation device according to claim 1, wherein
the housing interior has a compensating element for exchanging air with an environment.

19. The actuation device according to claim 1, wherein
the switching device has at least two electrical switching elements which are arranged in an actuation direction, so that an actuating sequence in which the switching elements are at least actuated successively or differently can be brought about by sweeping over the actuation device.

20. A vehicle comprising
a vehicle part,
wherein
an actuation device according to claim 1 for triggering a vehicle function of the vehicle is arranged on the vehicle part.

21. A method for actuation for triggering a vehicle function of a vehicle by means of an actuation device having a housing interior which is formed by a first and a second housing section of the actuation device and extending at least in regions between the second housing section and a fluid-tight deformation area of the first housing section, the deformation area being mechanically coupled to a circumferential connecting area of the first and second housing sections, the method comprising:
actuating a switching element of an electrical switching device by moving the second housing section from a rest position to an actuation position, wherein the fluid-tight deformation area is deformed and the connecting area is moved along, and
resiliently returning the second housing section to the rest position.

* * * * *